US009431084B2

(12) United States Patent
Bose et al.

(10) Patent No.: US 9,431,084 B2
(45) Date of Patent: *Aug. 30, 2016

(54) DETERMINING AND STORING BIT ERROR RATE RELATIONSHIPS IN SPIN TRANSFER TORQUE MAGNETORESISTIVE RANDOM-ACCESS MEMORY (STT-MRAM)

(71) Applicant: International Business Machines Corporation, Armonk, NY (US)

(72) Inventors: Pradip Bose, Yorktown Heights, NY (US); Alper Buyuktosunoglu, White Plains, NY (US); Xiaochen Guo, Rochester, NY (US); Hillery C. Hunter, Chappaqua, NY (US); Jude A. Rivers, Cortlandt Manor, NY (US); Vijayalakshmi Srinivasan, New York City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,172

(22) Filed: Jun. 30, 2014

(65) Prior Publication Data
US 2015/0206568 A1 Jul. 23, 2015

Related U.S. Application Data

(63) Continuation of application No. 14/159,605, filed on Jan. 21, 2014.

(51) Int. Cl.
*G11C 11/16* (2006.01)
*G11C 7/04* (2006.01)

(52) U.S. Cl.
CPC ............. *G11C 11/1675* (2013.01); *G11C 7/04* (2013.01); *G11C 11/1659* (2013.01)

(58) Field of Classification Search
CPC .. G11C 11/1675; G11C 11/1659; G11C 7/04
USPC ........... 365/80, 158, 171, 173; 257/421, 427
See application file for complete search history.

(56) References Cited

U.S. PATENT DOCUMENTS 6,701,393 B1   3/2004  Kemeny et al.
7,111,177 B1 * 9/2006  Chauvel .................. G06F 1/206
                                                           713/300

(Continued)

FOREIGN PATENT DOCUMENTS

EP         2320425 B1      5/2011
WO    WO2009158274 A1    12/2009
WO    WO2011143099 A1    11/2011

OTHER PUBLICATIONS

Ipek et al; "Dynamically replicated memory: building reliable systems from nanoscale resistive memories."; In ACM SIGARCH Computer Architecture News, vol. 38, No. 1, ACM, Mar. 2010., pp. 3-14.

(Continued)

*Primary Examiner* — Vu Le
*Assistant Examiner* — Sung Cho
(74) *Attorney, Agent, or Firm* — Toler Law Group, P.C.

(57) ABSTRACT

Systems and methods to manage memory on a spin transfer torque magnetoresistive random-access memory (STT-MRAM) are provided. A particular method may include determining a performance characteristic using relationship information that relates a bit error rate to at least one of a programming pulse width, a temperature, a history-based predictive performance parameter, a coding scheme, and a voltage level also associated with a memory. The performance characteristic is stored and used to manage a write operation associated with the memory.

15 Claims, 4 Drawing Sheets

(56) References Cited

U.S. PATENT DOCUMENTS

| | | | |
|---|---|---|---|
| 7,552,223 B1 | 6/2009 | Ackaouy et al. | |
| 7,930,470 B2* | 4/2011 | Brittain | G06F 13/1684 |
| | | | 711/105 |
| 8,331,183 B2 | 12/2012 | Lee et al. | |
| 8,411,483 B2 | 4/2013 | Lin et al. | |
| 8,713,252 B1 | 4/2014 | de la Iglesia et al. | |
| 2002/0065981 A1 | 5/2002 | Jenne et al. | |
| 2002/0124143 A1 | 9/2002 | Barroso et al. | |
| 2003/0046020 A1 | 3/2003 | Scheuerlein et al. | |
| 2005/0125797 A1 | 6/2005 | Gabrani et al. | |
| 2005/0270887 A1* | 12/2005 | Shimizu | G11C 11/16 |
| | | | 365/232 |
| 2006/0179333 A1* | 8/2006 | Brittain | G11C 5/143 |
| | | | 713/320 |
| 2008/0046766 A1 | 2/2008 | Chieu et al. | |
| 2009/0132873 A1 | 5/2009 | Joshi et al. | |
| 2009/0265598 A1* | 10/2009 | Lasser | G06F 11/1068 |
| | | | 714/746 |
| 2009/0323404 A1 | 12/2009 | Jung et al. | |
| 2010/0226465 A1* | 9/2010 | Nakayama | H04B 7/0871 |
| | | | 375/347 |
| 2011/0119538 A1 | 5/2011 | Ipek et al. | |
| 2011/0280065 A1* | 11/2011 | Rao | G11C 11/16 |
| | | | 365/171 |
| 2012/0127804 A1 | 5/2012 | Ong et al. | |
| 2012/0155158 A1* | 6/2012 | Higo | G11C 11/1677 |
| | | | 365/158 |
| 2012/0257448 A1 | 10/2012 | Ong | |
| 2012/0284589 A1 | 11/2012 | Kim et al. | |
| 2012/0300531 A1* | 11/2012 | Huang | G11C 11/161 |
| | | | 365/148 |
| 2013/0073240 A1 | 3/2013 | Kameyama et al. | |
| 2013/0111298 A1* | 5/2013 | Seroff et al. | 714/758 |
| 2013/0132652 A1* | 5/2013 | Wood | G06F 12/0246 |
| | | | 711/103 |
| 2013/0205085 A1* | 8/2013 | Hyun | G11C 16/10 |
| | | | 711/114 |
| 2013/0227268 A1 | 8/2013 | Ichida et al. | |
| 2013/0343117 A1* | 12/2013 | Lua | G11C 11/1675 |
| | | | 365/158 |
| 2014/0016404 A1* | 1/2014 | Kim | G11C 11/165 |
| | | | 365/158 |
| 2014/0098600 A1* | 4/2014 | Kim et al. | 365/158 |
| 2014/0101371 A1* | 4/2014 | Nguyen | G06F 3/0616 |
| | | | 711/103 |
| 2014/0112082 A1* | 4/2014 | Lee | G11C 7/20 |
| | | | 365/189.011 |
| 2014/0347918 A1* | 11/2014 | Lee | G11C 11/1675 |
| | | | 365/158 |
| 2014/0379940 A1 | 12/2014 | Fulkerson et al. | |

OTHER PUBLICATIONS

Smullen et al; "Relaxing non-volatility for fast and energy-efficient STT-RAM caches," High Performance Computer Architecture (HPCA), 2011 IEEE 17th International Symposium on, Feb. 2011., pp. 50-61.
List of IBM Patents or Patent Applications Treated As Related.
J.M. Slaughter, "Materials for Magnetoresistive Random Access Memory", Annual Review of Materials Research. vol. 39: Aug. 2009, pp. 277-296.
Liu, et al., "RAIDR: Retention-Aware Intelligent DRAM Refresh," Proceedings of the 39th Annual International Symposium on Computer Architecture (ISCA), Jun. 2012, pp. 1-12.
Y. Chen, et al., "A nondestructive Self-Reference Scheme for Spin-Transfer Torque Random Access Memory (STT-RAM)," Design, Automation & Test in Europe Conference & Exhibition, Mar. 2010,, pp. 148-153.
Zhou, et al., "Energy reduction for STT-RAM Using Early Write Termination," ICCAD 09' Proceedings of the 2009 IEEE/ACM International Conference on Computer-Aided Design, Nov. 2009, pp. 264-268.

* cited by examiner

DETERMINING AND STORING BIT ERROR RATE RELATIONSHIPS IN SPIN TRANSFER TORQUE MAGNETORESISTIVE RANDOM-ACCESS MEMORY (STT-MRAM)

I. CROSS REFERENCE TO RELATED APPLICATIONS

This application is a continuation application and claims priority from U.S. patent application Ser. No. 14/159,605, entitled "Determining and Storing Bit Error Rate Relationships In Spin Transfer Torque Magnetoresistive Random-Access Memory (STT-MRAM)," by the same inventors, filed on Jan. 21, 2014, which is incorporated herein in its entirety.

II. FIELD OF THE DISCLOSURE

The present disclosure relates generally to computing architectures, and in particular, to a system and a method of managing memory.

III. BACKGROUND

Spin transfer torque magnetoresistive random-access memory (STT-MRAM) is a nonvolatile memory technology. The probability of writing a correct value in an STT-MRAM generally increases with the duration of the write pulse, or write pulse width. Put another way, the more time that is taken to write a value into the memory cell, the more likely that the written value will be correct. There is an upper limit of the write pulse width, beyond which there is no additional benefit in terms of write reliability. Increased reliability via write pulse width increase is generally obtained at the cost of increased write latency and energy consumption.

IV. SUMMARY OF THE DISCLOSURE

According to a particular embodiment, a method may include determining a performance characteristic using relationship information that relates a bit error rate to at least one of a programming pulse width, a temperature, a history-based predictive performance parameter, a coding scheme, and a voltage level also associated with a memory. The performance characteristic is stored and used to manage a write operation associated with the memory. The memory may comprise an STT-MRAM.

Using the performance characteristic may include determining whether to perform at least one of a long write operation or a short write operation. Embodiments may vary the programming pulse width, coding scheme, and/or the bit error rate. The temperature may be detected at the memory, and the performance characteristic may be determined at test time or runtime. The performance characteristic may be determined at the memory, as opposed to a main memory controller. The method may further include determining whether the memory supports a long write operation and may additionally comprise determining a number of data flips associated with data. The performance characteristic may be stored in the memory.

According to another particular embodiment, an apparatus may include a memory storing a performance characteristic determined from relationship information relating to at least two of a bit error rate, a programming pulse width, a history based predictive performance parameter, a temperature, a coding scheme, and a voltage level associated with a memory. A controller in communication with the memory may be configured to determine the performance characteristic and to use the performance the characteristic to manage a write operation to the memory.

The performance characteristic may include varying the programming pulse width. The relationship information may include a relationship between the bit error rate and at least one of the programming pulse width, the history based predictive performance parameter, the temperature, the coding scheme, and the voltage level associated with the memory. The apparatus may include a temperature sensor configured to detect the temperature associated with the memory and to communicate the temperature to the controller.

According to another particular embodiment, a computer readable storage medium includes instructions, that when executed by a processor, cause the processor to determine a performance characteristic that includes relationship information relating to a bit error rate relating to at least one of a programming pulse width, a temperature, history-based predictive performance parameter, a coding scheme, and a voltage level also associated with a memory. The performance characteristic may be stored and used to manage a write operation associated with the memory.

An embodiment may manage write operations in an STT-MRAM in a manner that reduces power consumption and processing latency. For example, variably adjusting a length of a programming pulse width may reduce power consumption by using shorter lengths when higher temperatures are present. Processes may be transparent to a main memory controller, e.g., only the microchip may be aware of a changing latency.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. BRIEF DESCRIPTION OF THE DRAWINGS

FIG. 1 generally illustrates a data processing apparatus configured to support embodiments to manage memory by adjusting programming pulse widths according to known bit error rate relationships;

VI. DETAILED DESCRIPTION

Figure 1:
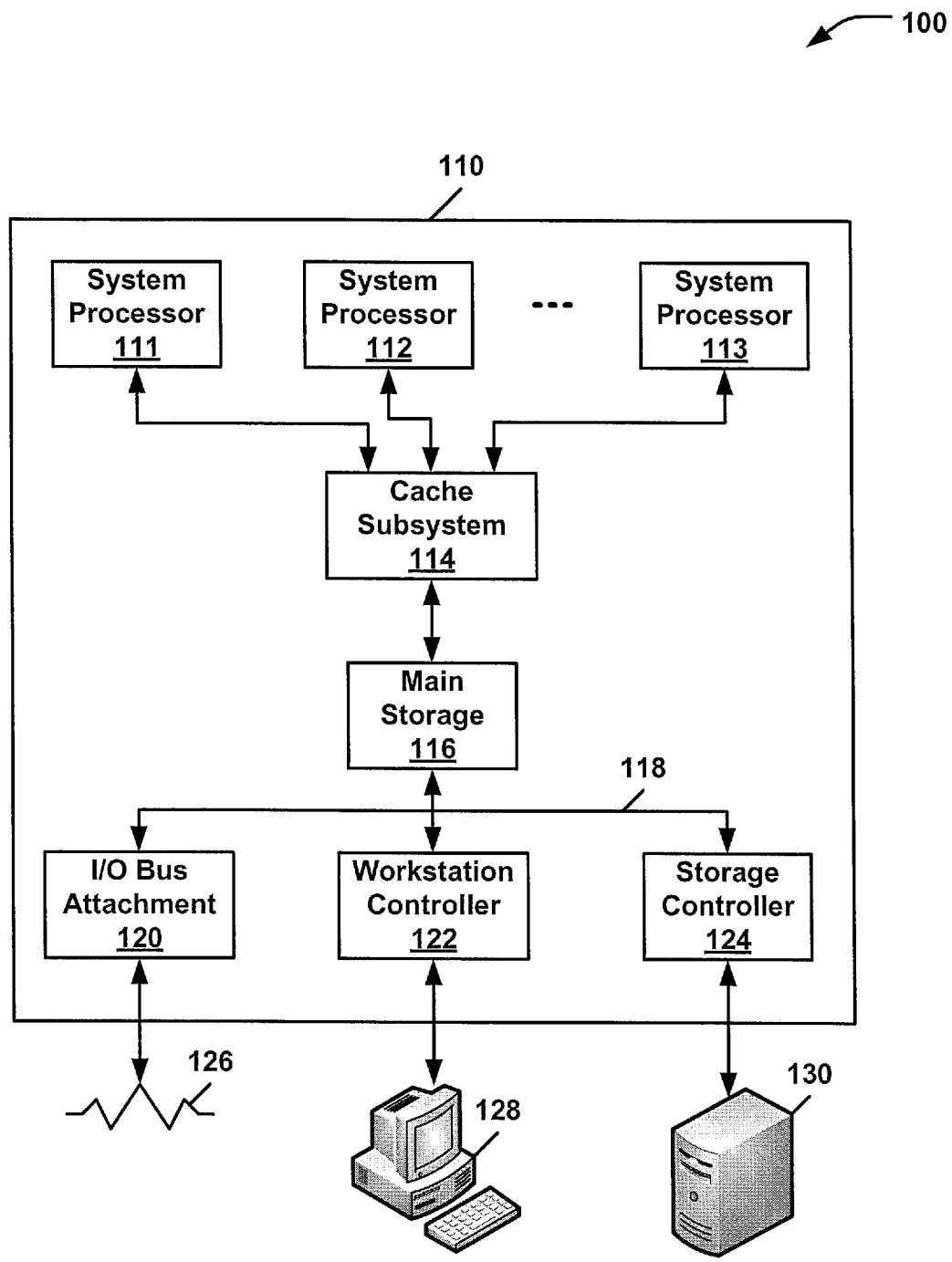

Write performance in an STT-MRAM may depend on a length of a programming pulse width, or the length of the pulse used to write the data. For example, longer programming pulse widths may result in higher power consumption and greater accuracy. The amount of time elapsing during the write operation to the STT-MRAM is referred to as write pulse width, write pulse length, or write latency. An embodiment capitalizes on the fact that the write latency required to achieve a targeted level of reliability is inversely related to the operating temperature of the memory data array and associated logic.

Embodiments may include adaptive programming pulse widths to write to memory according to stored relationships. The relationships may associate one or more of a bit error rate, a temperature, a voltage, historical predictive data, and coding. Coding may include additional error handling and redundancy processes (e.g., parity coding, error correction code (ECC), and memory mirroring) used to increase reliability given a particular programming pulse width and varying parameters discussed herein.

According to a particular embodiment, relationship information may include bit error rates stored in association with several performance parameters. For example, bit error rates for an STT-MRAM may be managed based on bit error rate versus one or more of: programming pulse width, temperature, coding, and voltage. STT-MRAM bit error rate characterization information and processes may be stored to relate bit error rates to programming pulse width, temperature, coding, and voltage. Thermal dependence of STT-MRAM bit error rates may be determined at test time or runtime. The information may be stored for system use.

Memory commands may include variable write latencies, and a bit error rate may be determined for the STT-MRAM. Adaptive error detection and correction coding in the STT-MRAM may be performed. Write latency with dynamic temperature adjustments in the STT-MRAM may be improved. Methods may be performed using embedded cache technology and as discrete microchips comprising a main memory system.

Methods may vary write latency and programming pulse width capability. For example, an internal write latency of a microchip may differ, while an external write latency remains constant. A microchip may include an internal thermal sensor. Where the microchip determines a high temperature condition is present, a short programming pulse width may be adequate and consequently used. Where the microchip is alternatively at a low temperature, a long programming pulse width may be used. Determining whether to use a long or short programming pulse width based on a detected microchip temperature may preserve power (or energy) because shorter write latencies (which use relatively less power) are used when hotter temperatures are present. Processes may be transparent to a main memory controller, e.g., only the microchip may be aware of a changing latency. In one example, a write operation may take 50 nanoseconds. A memory controller may consequently assume that the microchip is busy with an internal write operation for 50 nanoseconds. However, if the microchip was determined to be hot, the write operation may have finished early (e.g., 40 nanoseconds).

Stored bit error rate relationship information of an STT-MRAM may include STT-MRAM bit error rate versus programming pulse width, bit error rate versus temperature, and bit error rate versus voltage. Such relationships may vary across different manufacturers and may be determined at run or test time. The bit error rate relationship information may be stored within a table anywhere in the system, such as within the STT-MRAM microchip. The STT-MRAM microchip is nonvolatile and may include suitable storage for the table to store its own bit error rate relationship information. Such information may alternatively be stored in a cache controller or in a dual in-line memory module (DIMM) register, among other locations. A memory controller (conventionally having only a read and write command) may include a fast write command and a slow write command, in addition to the read command.

Embodiments of methods to exploit the natural physical phenomena that as temperature increases, writes to STT-MRAM become faster. Benefits from higher temperatures (e.g., associated with higher voltages) may be realized at a cost of reliability. Retention time in the STT-MRAM may be reduced with higher temperatures. The reduced retention time may translate into diminished reliability. Known relationships may be leveraged to provide a desired level of reliability.

An STT-MRAM system with thermal monitoring may adjust one or more of a level of coding, redundancy, and programming pulse width to maintain or improve a bit error rate in response to a temperature change. To this end, a bit error rate versus temperature relationship may be known, in addition to a bit error rate versus programming pulse width relationship. For a constant programming duration, an STT-MRAM bit error rate may rise with temperature. This relationship may also depend on the programming pulse width. A set of bit error rate thresholds versus coding and redundancy parameters may also be known. A bit error rate threshold may include a bit error rate at which a particular coding (such as, parity coding, ECC, and memory mirroring processes) is to be used. The bit error rate thresholds may be hard programmed into system logic or may be programmable (e.g., via a table or software settings). The bit error rate thresholds may alternatively be calculated by a memory controller or other system logic.

In an embodiment where a bit error rate is desired to be maintained at a constant level, a programming pulse width may be adjusted as a temperature changes. Coding (such as, parity coding, ECC, and memory mirroring processes) may remain the same. In another embodiment, coding processes may be adjusted in response to temperature change to maintain performance (e.g., the write latency). Adjustments may be static or dynamic. For example, static settings may be stored and accessed across different system implementations within a design family. Another system may monitor temperature and dynamically adjust one or more of pulse length and coding.

In one scenario, an STT-MRAM may be designed to deliver a parity-suited bit error rate at a specified programming pulse width "p" (e.g., measured in nanoseconds) at a temperature of 30° C. For standard operation, memory operation may be relatively fast (e.g., a short programming pulse width) and only parity checks may be applied. As a the temperature rises to 60° C., the programming pulse width, or programming duration, may be kept at p, but the coding may be adjusted. For example, ECC may be used in order to maintain an acceptable overall system (RAS) level. Where a thermal rise to 60° C. is detected, a size of the programming pulse width may be maintained, but data memory mirroring operations may be used. Alternatively or additionally, the programming pulse width may be lengthened to maintain a desired reliability.

Turning more particularly to the drawings, FIG. 1 generally illustrates a data processing apparatus 100 configured to support embodiments to manage memory by adjusting programming pulse widths according to known bit error rate relationships. The apparatus 100 may generally include a computer, a computer system, a computing device, a server, a disk array, client computing entity, or other programmable device, such as a multi-user computer, a single-user computer, a handheld device, a networked device (including a computer in a cluster configuration), a mobile phone, a video game console (or other gaming system), etc. The apparatus 100 may be referred to as a logically partitioned computing system or computing system, but may be referred to as computer for the sake of brevity. One suitable implementation of the computer 110 may be a multi-user computer, such as a computer available from International Business Machines Corporation (IBM).

The computer 110 generally includes one or more physical processors 111, 112, 113 coupled to a memory subsystem including a main storage 116. The main storage 116 may include one or more STT-MRAMs. Another or the same embodiment may include a main storage having a static random access memory (SRAM), a dual in-line memory module (DIMM) a flash memory, a hard disk drive, and/or another digital storage medium. The processors 111, 112, 113 may be multithreaded and/or may have multiple cores. A cache subsystem 114 is illustrated as interposed between the processors 111, 112, 113 and the main storage 116. The cache subsystem 114 typically includes one or more levels of data, instruction and/or combination caches, with certain caches either serving individual processors or multiple processors.

The main storage 116 may be coupled to a number of external input/output (I/O) devices via a system bus 118 and a plurality of interface devices, e.g., an I/O bus attachment interface 120, a workstation controller 122, and/or a storage controller 124 that respectively provide external access to one or more external networks 126, one or more workstations 128, and/or one or more storage devices 130, such as a direct access storage device (DASD). In a particular embodiment, the storage device 130, device 114, or 116 may include an STT-MRAM. The system bus 118 may also be coupled to a user input (not shown) operable by a user of the computer 110 to enter data (i.e., the user input sources may include a mouse, a keyboard, etc.) and a display (not shown) operable to display data from the computer 110 (i.e., the display may be a CRT monitor, an LCD display panel, etc.). The computer 110 may also be configured as a member of a distributed computing environment and communicate with other members of that distributed computing environment through a network 126.

Figure 2:
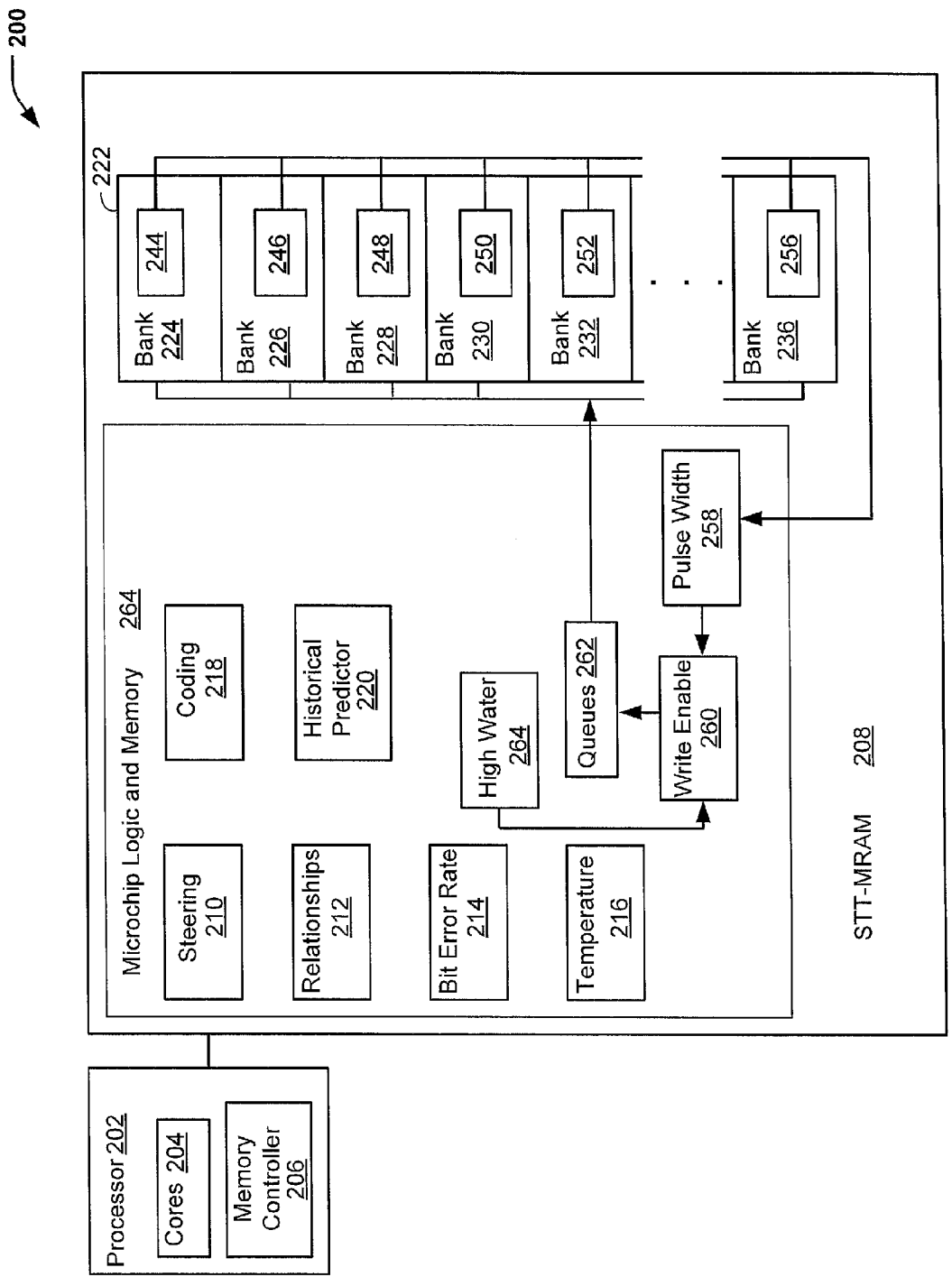
FIG. 2 shows an embodiment of a system configured to manage memory operations using bit error rate relationships in an STT-MRAM.

FIG. 2 shows an embodiment of a system 200 configured to manage memory operations using bit error rate relationships in an STT-MRAM 208. The system 200 may generally be supported within the computing environment 100 of FIG. 1. The system 200 may manage write operations in an STT-MRAM 208 using known relationships 212 in a manner that reduces power consumption and processing latency.

A processor microchip 202 of the system 200 may continuously send memory requests to the STT-MRAM 208. As shown in FIG. 2, the processor microchip 202 may include processor cores 204 and a main memory controller 206.

The STT-MRAM 208 may include multiple memory banks 224, 226, 228, 230, 232, 236. Each memory bank 224, 226, 228, 230, 232, 236 may be associated with a respective one of a number of queues 262. The memory requests from the processor microchip 202 may be addressed for a specific memory bank 224, 226, 228, 230, 232, 236 and an associated one of the queues 262. A steering module 210 of the system 200 may direct the memory requests to the appropriate queue 262 according to an address of the destination memory bank 224, 226, 228, 230, 232, 236.

A high water mark module 264 may facilitate management of incoming memory requests by accounting and adjusting for the incoming and outgoing traffic. For example, the high water mark module 264 may indicate the fullness (e.g., of waiting write requests) of a particular queue 262. The high water mark module 264 may be incremented in response to an incoming memory request and may be decremented whenever a memory request at the head of the queue 262 is issued to an appropriate memory bank 224, 226, 228, 230, 232, 236. When a queue 262 associated with a memory bank 224 becomes full, it may no longer receive new memory requests.

The memory banks 224, 226, 228, 230, 232, 236 may include one or more temperature sensors 244, 246, 248, 250, 252, 256. The temperature sensors 244, 246, 248, 250, 252, 256 may individually or collectively detect an average temperature of a memory bank or array of memory banks 224, 226, 228, 230, 232, 236.

A pulse width determiner 258 may adjust the programming pulse width for writing to the specific memory bank or the multiple memory banks 224, 226, 228, 230, 232, 236 based on the detected temperature 216, as well as on other inputs. Illustrative such inputs may include one or more of a desired coding strength 218, an application requirement 220, and a history based predictive performance parameter 220 associated with past performance of the system.

Relationship information 212 may be stored in a manner that is accessible to the pulse width determiner 258. In a particular embodiment, the relationship information 212 includes bit error rates for the STT-MRAM 208 stored versus one or more of: programming pulse width, temperature, coding, and a voltage. Voltage in some cases may vary proportionally with temperature. Incidentally, comparable relationships do not exist for dynamic random-access memory (DRAM). While such relationship information 212 is shown in FIG. 2 as being stored internally to the STT-MRAM 208, such relationship information may be stored elsewhere in another embodiment. Additionally, while an STT-MRAM is illustrated in FIG. 2, another embodiment may include another memory variant having characteristics advantageously affected by the processes described herein.

The programming pulse width determined by the pulse width determiner 258 may be provided as an input to a write enable module 260. Another input to the write enable module 260 may be provided by the high water mark module 264. Based on these inputs, the write enable module 260 may write the memory request sitting at the head of the queue 262 to the designated bank 232 with the determined programming pulse width. The write process, including the programming pulse width, may be continuously adjusted in this manner based on the temperature and other inputs from the stored relationship information 212.

Figure 3:
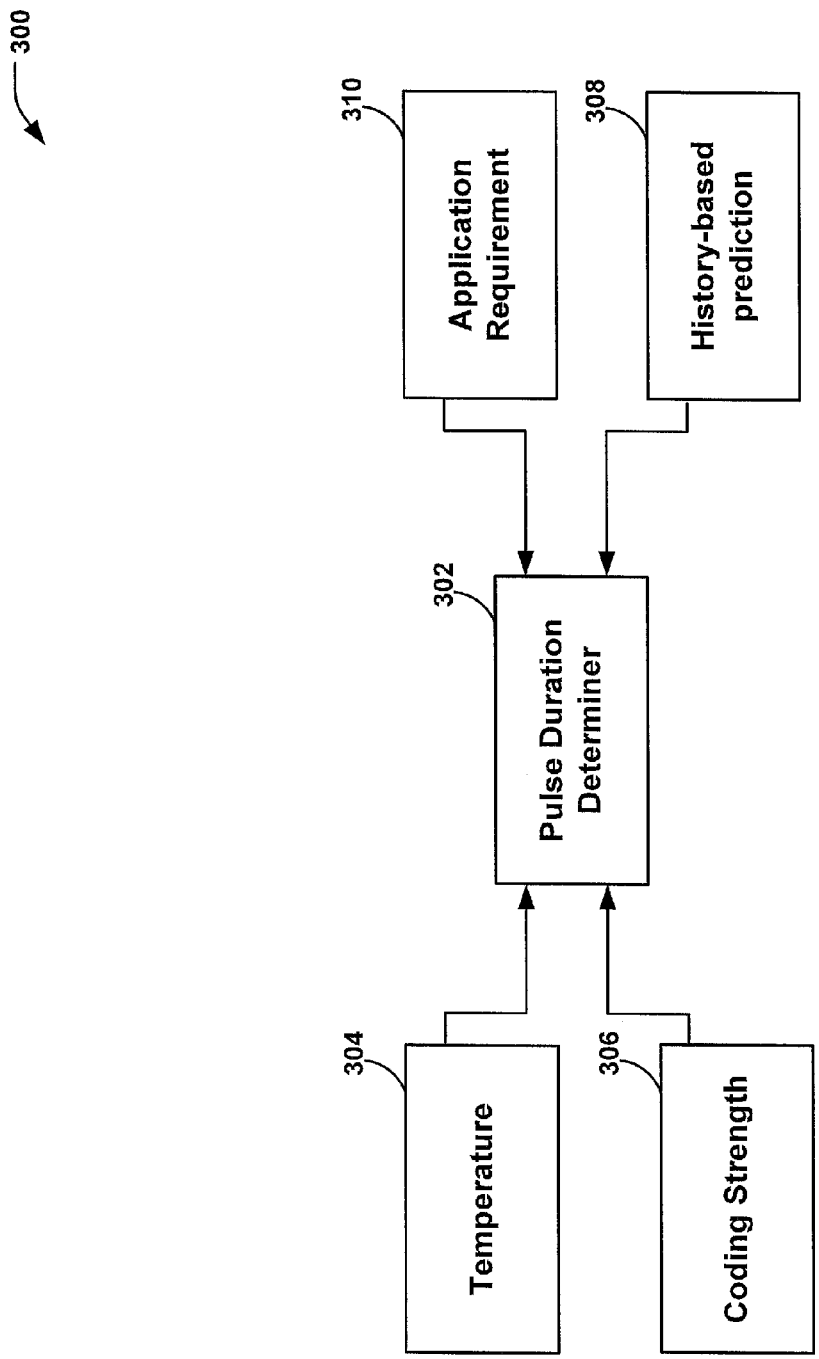
FIG. 3 is a block diagram illustrating a system having inputs executed by logic of a pulse width determiner.

FIG. 3 is a block diagram illustrating a system 300 having inputs executed by logic of a pulse width determiner 302. While embodiments contemplate additional inputs, the four illustrative inputs may be generated from a temperature module 304, a coding strength module 306, an applications requirement module 310, and a history based prediction module 308.

As discussed herein, pulse width determiner 302 may include logic, or program code, configured to determine a programming pulse width based on one or more of a detected temperature, a desired coding strength, an application requirement, and a history-based predictive performance parameter associated with past performance of the system. The determined pulse width may be used to write a specific memory bank or to multiple memory banks.

A temperature provided by the temperature module 304 may include a sensed temperature of a memory bank or other portion of an STT-MRAM microchip, not limited to the entire microchip. The temperature may further include an average of multiple sensed temperatures at the memory banks, as well as at other portions of the STT-MRAM microchip. Thermal dependence of STT-MRAM bit error rates may be determined at test time or runtime. The information may be stored for system use.

Coding information from the coding strength module 306 may include parity coding, ECC, memory mirroring processes, and other processes used to improve reliability and performance. Historical based prediction data, or history based predictive performance parameters, may include empirical data stored during test or run time that may relate to the bit error rate or another parameter affecting a known, stored pulse width under conditions similar to those at the time the historical data was stored. Application requirements may be programmable and may vary depending upon application specific functions. However, one example of an application requirement may include a desired bit error rate. Though not shown in FIG. 3, a voltage input associated with the STT-MRAM may also be provided as an input to the pulse width determiner 302. Voltage may vary proportionally with temperature.

Figure 4:
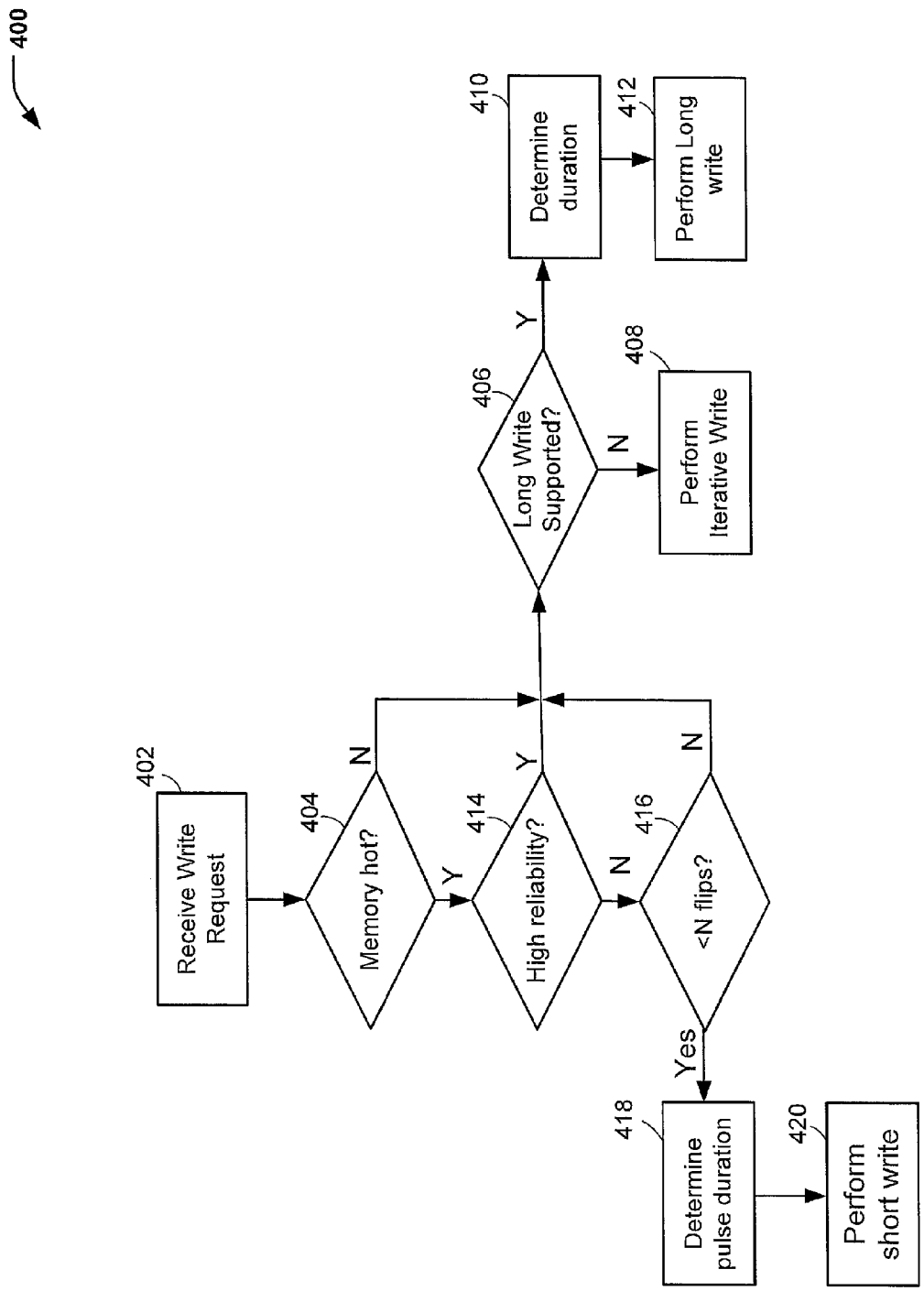
FIG. 4 is flowchart illustrating an embodiment of a method of managing memory that includes determining programming pulse width at least in part by a temperature of an STT-MRAM microchip.

FIG. 4 is flowchart illustrating an embodiment of a method 400 of managing memory that includes determining programming pulse width at least in part by a temperature of an STT-MRAM microchip. Turning more particularly to the steps of the flowchart, a write request to STT-MRAM may be received at 402. In response, a temperatures sensor may determine at 404 whether the STT-MRAM is warmer than a preset temperature threshold.

Where the STT-MRAM is not warmer than the threshold at 404, the system may determine at 406 whether the STT-MRAM microchip supports long writes. Where the STT-MRAM microchip is determined at 406 to not support long writes, the system at 408 may determine whether to perform an iterative write. The iterative write may include immediate read and verify operations leading to a short write to complete the operation. Where the STT-MRAM microchip at 406 alternatively does not support long writes, the system may determine at 410 how long the write should be, or the programming pulse width. The programming pulse width determination may be based on one or more of a detected temperature, a desired coding strength, an application requirement (e.g., a bit error rate), and a history-based predictive performance parameter associated with past performance of the system. Based on the programming pulse width determination at 410, the system at 412 may perform a long write operation.

Where the STT-MRAM is determined at 404 to be hot (e.g., having a temperature above a preset threshold), then it may be determined at 414 whether a high level of reliability is desired. Where a high level of reliability is desired at 414, the system may determine (back at 406) whether a long write operation is supported.

Where high reliability is alternatively not needed at 414, the system may determine at 416 the number of flips that may occur. The number of flips of an embodiment may be determined by an XOR function that processes existing and incoming data. Where the number of flips is greater than an acceptable threshold at 416, the system may determine (back at 406) whether a long write operation is supported. Where the number of flips is alternatively less than the acceptable threshold at 416, the system may directly determine the programming pulse width at 418 and perform a short write operation at 420. As discussed herein, selectively performing the short write operation may reduce power consumption and system latency while maintaining a desired system reliability level.

Particular embodiments described herein may take the form of an entirely hardware embodiment, an entirely software embodiment or an embodiment containing both hardware and software elements. In a particular embodiment, the disclosed methods are implemented in software that is embedded in processor readable storage medium and executed by a processor, which includes but is not limited to firmware, resident software, microcode, etc.

Further, embodiments of the present disclosure, such as the one or more embodiments may take the form of a computer program product accessible from a computer-usable or computer-readable storage medium providing program code for use by or in connection with a computer or any instruction execution system. For the purposes of this description, a non-transitory computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A method of managing memory, the method comprising:

determining a performance characteristic of a memory based on a relationship between a bit error rate, a programming pulse width, and one or more of: a temperature, a history-based predictive performance parameter, a coding scheme for data, or a voltage level associated with the memory, wherein the programming pulse width is a length of a pulse used to write the data;

storing the performance characteristic in the memory; and managing a write operation associated with the memory using the stored performance characteristic, wherein using the performance characteristic includes determining whether to perform at least one of a long write operation, a sequence of short write operations, or a single short write operation.

2. The method of claim 1, wherein the memory is a spin transfer torque magnetoresistive random-access memory (STT-MRAM).

3. The method of claim 1, wherein using the performance characteristic further includes varying the programming pulse width.

4. The method of claim 1, wherein using the performance characteristic further includes varying the coding scheme.

5. The method of claim 1, further comprising determining the bit error rate of the memory.

6. The method of claim 1, further comprising detecting the temperature of the memory.

7. The method of claim 1, further comprising determining the performance characteristic at runtime.

8. The method of claim 1, further comprising determining the performance characteristic at test time.

9. The method of claim 1, wherein the history-based predictive performance parameter is associated with past performance of the memory.

10. The method of claim 1, further comprising determining the performance characteristic at the memory, wherein the memory is coupled to a main memory controller.

11. The method of claim 1, further comprising determining whether the memory supports the long write operation.

12. The method of claim 1, further comprising determining a number of data flips associated with data.

13. A method of managing memory, the method comprising:
   determining a performance characteristic of a memory based on a relationship between two or more of: a bit error rate, a programming pulse width, a temperature, a history-based predictive performance parameter, a coding scheme for data, or a voltage level associated with the memory, wherein the programming pulse width is a length of a pulse used to write the data;
   storing the performance characteristic in the memory; and
   managing a write operation associated with the memory based on the performance characteristic and based on a number of data flips that are to be performed in response to a determination that the temperature is above a first threshold value, wherein the number of data flips is based on an exclusive-OR operation; and
   determining the programming pulse width and subsequently performing one of: a long write operation in response to a determination that the number of data flips is greater than a second threshold value or a short write operation in response to a determination that the number of data flips is less than the second threshold value.

14. The method of claim 13, further comprising varying the coding scheme for data to be written to the memory using the performance characteristic.

15. A method of managing memory, the method comprising:
   determining a performance characteristic of a memory based on a relationship between a programming pulse width, and one or more of: a bit error rate, a temperature, a history-based predictive performance parameter, a coding scheme for data, or a voltage level associated with the memory, wherein the programming pulse width is a length of a pulse used to write the data;
   storing the performance characteristic in the memory;
   managing a write operation associated with the memory based on the performance characteristic and based on a number of data flips that are to be performed in response to a determination that the temperature is above a first threshold value, wherein the number of data flips is based on an exclusive-OR operation; and
   determining the programming pulse width and subsequently performing one of: a long write operation in response to a determination that the number of data flips is greater than a second threshold value or a short write operation in response to a determination that the number of data flips is less than the second threshold value.

* * * * *